US012334274B2

(12) United States Patent
Van Der Wiel et al.

(10) Patent No.: US 12,334,274 B2
(45) Date of Patent: Jun. 17, 2025

(54) TRENCH CAPACITORS

(71) Applicants: Melexis Technologies NV, Tessenderlo (BE); X-FAB Global Services GmbH, Erfurt (DE)

(72) Inventors: Appo Van Der Wiel, Tessenderlo (BE); Piet De Pauw, Ypres (BE); Ralf Lerner, Erfurt (DE)

(73) Assignees: Melexis Technologies NV, Tessenderlo (BE); X-FAB Global Services GmbH, Erfurt (DE)

( * ) Notice: Subject to any disclaimer, the term of this patent is extended or adjusted under 35 U.S.C. 154(b) by 91 days.

(21) Appl. No.: 18/306,731

(22) Filed: Apr. 25, 2023

(65) Prior Publication Data

US 2023/0386752 A1 Nov. 30, 2023

(30) Foreign Application Priority Data

May 27, 2022 (EP) ..................................... 22175743

(51) Int. Cl.
*H01G 4/33* (2006.01)
*H01G 4/01* (2006.01)
*H01G 4/012* (2006.01)
*H01G 4/38* (2006.01)
*H10D 1/00* (2025.01)
*H10D 1/68* (2025.01)

(52) U.S. Cl.
CPC .................. *H01G 4/33* (2013.01); *H01G 4/01* (2013.01); *H01G 4/012* (2013.01); *H01G 4/385* (2013.01); *H10D 1/043* (2025.01); *H10D 1/716* (2025.01)

(58) Field of Classification Search
CPC ............ H01G 4/33; H01G 4/01; H01G 4/012; H01G 4/385; H01L 28/92
See application file for complete search history.

(56) References Cited

U.S. PATENT DOCUMENTS

| 11,195,958 B2* | 12/2021 | Hu | ..................... H01L 29/42368 |
| 2002/0121673 A1* | 9/2002 | Jono | .................. H01L 21/76232 |
| | | | 257/E21.654 |
| 2009/0256239 A1* | 10/2009 | Pompl | .................. H01L 27/0805 |
| | | | 257/E21.011 |

(Continued)

FOREIGN PATENT DOCUMENTS

EP 2423947 A2 2/2012

OTHER PUBLICATIONS

Healy et al., "The variation and visualisation of elastic anisotropy in rock-forming minerals", Solid Earth vol. 11, Mar. 2, 2020, pp. 259-286.

(Continued)

*Primary Examiner* — Michael P McFadden
(74) *Attorney, Agent, or Firm* — Workman Nydegger

(57) ABSTRACT

A unit trench capacitor in a substrate includes one or more trenches in the substrate, a dielectric layer, a first electrode and a second electrode. Walls of the one or more trenches are covered by the dielectric layer which separates the first electrode from the second electrode. Each trench follows a closed curve. The closed curve of each trench has one or more elongated parts in directions in which the substrate has a maximum elastic modulus, or the closed curve of each trench has a circular shape if the substrate has an isotropic elastic modulus.

16 Claims, 7 Drawing Sheets

(56) References Cited

U.S. PATENT DOCUMENTS

| | | | |
|---|---|---|---|
| 2010/0316911 A1* | 12/2010 | Tesson | H01L 27/0207 |
| | | | 174/250 |
| 2011/0037145 A1 | 2/2011 | Lee et al. | |
| 2012/0286392 A1* | 11/2012 | Pei | H01L 29/66181 |
| | | | 257/532 |
| 2013/0161792 A1 | 6/2013 | Tran et al. | |
| 2015/0371893 A1* | 12/2015 | Chou | H01L 21/84 |
| | | | 257/621 |
| 2019/0035880 A1 | 1/2019 | Voiron et al. | |
| 2020/0058805 A1 | 2/2020 | Lu et al. | |
| 2021/0013303 A1* | 1/2021 | Chen | H10B 41/10 |
| 2023/0066352 A1* | 3/2023 | Liu | H01L 28/91 |
| 2023/0102582 A1* | 3/2023 | Fukae | H01L 29/401 |
| | | | 257/301 |

OTHER PUBLICATIONS

Hopcroft et al., "What is the Young's Modulus of Silicon?," Journal Of Microelectromechanical Systems, Apr. 2010, pp. 229-238, vol. 19, No. 2.

Extended European Search Report from Corresponding European Patent Application No. EP 22175743.8, Jan. 4, 2023.

WaferPro, "Understanding Silicon Wafer Orientation And Crystal Structure", published Jan. 13, 2024, retrieved Jan. 31, 2025 at https://waferpro.com/understanding-silicon-wafer-orientation-and-crystal-structure/#:~:text=So%20while%20(100)%20wafers%20tend,that%20are%20useful%20for%20certain.

\* cited by examiner

TRENCH CAPACITORS

FIELD OF THE INVENTION

The invention relates to the field of trench capacitors. More specifically it relates to a trench capacitor structure integrated in a substrate.

BACKGROUND OF THE INVENTION

Integration of capacitors in semiconductor substrates, and in particular in trenches, is state of the art.

US20190035880A1 for example discloses a 3D-capacitor structure that is based on a trench network etched from a top face of a substrate to form an array of separated pillars.

Capacitors may for example be implemented in power management applications. Also other applications can be envisaged. The power management applications allow to understand different constraints which may be imposed on a capacitor.

In modern power management there are transformations of voltages and currents between different power domains. These transformations are done by power converters using switching elements, as transistors, that are controlled by a dedicated controlling scheme.

Especially during switching, there are high voltage transients that might lead to electromagnetic disturbances and could even destroy the switching transistors. Depending on the power domains, and the switch technology employed, such transients could be in the range from 25 MV/µs e.g. for silicon carbide transistors up to well above 100 MV/µs e.g. for gallium nitride transistors.

In order to suppress these transients, so called snubber structures can be used. In a simple implementation a snubber can be a capacitor or a series connection of a resistor and a capacitor (RC-Snubber).

The snubber structure is preferably connected with short wires directly on the power rails in order to keep parasitic inductances low. It is further preferred to connect these snubbers directly on the switching elements for the same reason.

A capacitor can be optimized for different characteristics (e.g. as part of an snubber, e.g. a RC snubber) might be derived:

The unit capacitance is preferably as high as possible (it allows for example to integrate small devices in a power converter module)

The break down voltage is also preferably as high as possible

The capacitor is preferably robust and stable at high temperature (suppression of transients may for example heat up the device. When the capacitor is integrated in a power converter, this may result in considerable amounts of heat through the losses heating up the module. For instance 3% losses in a 333 kW converter are 10 kW heat.

The capacitor preferably has a high reliability. The device comprising the capacitor, therefore, preferably has a low intrinsic mechanical stress in order not to break down or to crack mechanically. Therefore mechanical breakdown of the trench capacitor should be avoided. A mechanical crack goes together with a reduction of the breakdown voltage or with capacitor leakage currents. Intrinsic mechanical stress under temperature increase might also develop to a temperature related mechanical breakdown.

There is therefore a need for trench capacitors which have a reduced intrinsic mechanical stress.

SUMMARY OF THE INVENTION

It is an object of embodiments of the present invention to provide a good trench capacitor.

The above objective is accomplished by a method and device according to the present invention.

In a first aspect embodiments of the present invention relate to a unit trench capacitor in a substrate. The unit trench capacitor comprises one or more trenches in the substrate, a dielectric layer, a first electrode and a second electrode. Walls of the one or more trenches are covered by the dielectric layer which separates the first electrode from the second electrode. Each trench follows a closed curve, and the closed curve of each trench has one or more elongated parts in directions in which the substrate has a maximum elastic modulus, or wherein the closed curve of each trench has a circular shape if the substrate has an isotropic elastic modulus.

In embodiments of the present invention changes in direction of the trenches are following a rounded part in the closed curve.

In embodiments of the present invention the unit trench capacitor comprises more than 2 trenches, wherein the trenches are arranged concentrically.

In embodiments of the present invention the rounded parts of adjacent trenches are parallel with each other.

In embodiments of the present invention a depth of the trench is between 5 and 100 µm.

In embodiments of the present invention a width of the trench is between 1 and 10 µm.

In embodiments of the present invention the unit trench capacitor comprises at least two trenches, wherein a pitch between neighboring trenches is between 2 and 20 µm.

In embodiments of the present invention the substrate is a semiconductor substrate.

In embodiments of the present invention the first electrode is the semiconductor substrate.

In embodiments of the present invention the substrate is a dielectric substrate.

In embodiments of the present invention the closed curve has a square or rectangle or rhomboid, or hexagonal, or circular, or ellipsoidal shape.

In embodiments of the present invention the elastic modulus has a periodicity of 90° and the closed curve has a substantially square shape.

In embodiments of the present invention the elastic modulus has a periodicity of 180° and the closed curve has a substantially rectangular shape.

In a second aspect embodiments of the present invention relate to a trench capacitor which comprises a plurality of unit trench capacitors which are connected in parallel.

An RC-snubber device according to embodiments of the present invention is configured to suppress transients in an electrical system. It therefore comprises a resistor connected in series with a trench capacitor according or a unit trench capacitor according to embodiments of the present invention.

In a third aspect embodiments of the present invention relate to a method for making a unit trench capacitor. The method comprises:

providing a substrate, making one or more trenches in the substrate wherein each trench follows a closed curve, and wherein the closed curve of each trench has one or more elongated parts in directions in which the substrate has a maximum elastic modulus or wherein the closed curve of each trench has a circular shape if the substrate has an isotropic elastic modulus, providing a dielectric layer, a first electrode and a second electrode, such that walls of the one or more trenches are covered by a dielectric layer which separates the first electrode from the second electrode.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
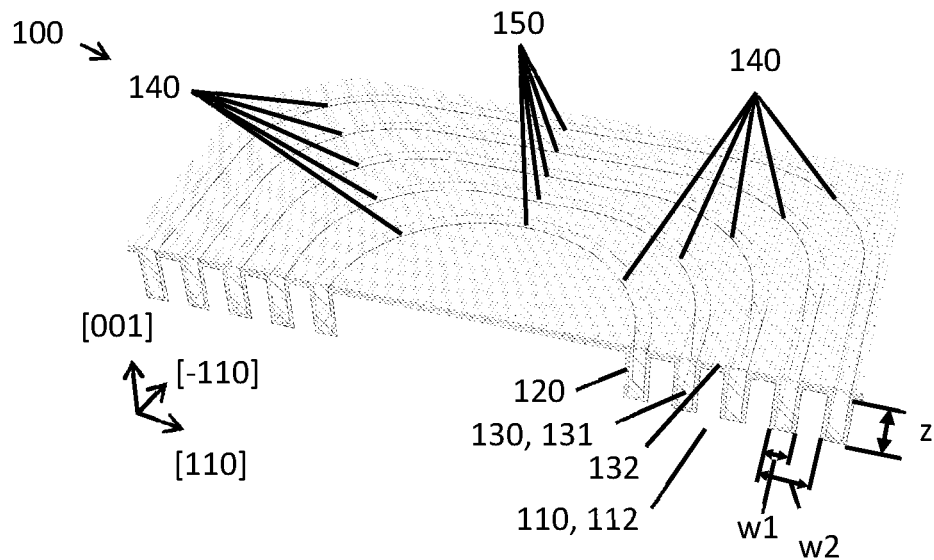
FIG. 1 shows a 3D schematic drawing of a cross section of a unit trench capacitor in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the Young's modulus or the elastic modulus (E) of a solid material reference is made to the tensile or compressive stiffness of the solid material in a certain direction. In other words the modulus of Young describes the elasticity of the material in different directions.

The modulus of Young is dependent on the crystal orientation and may have symmetries which are dependent on the material and on the surface plane as will be discussed later. Wafers for manufacturing semiconductor devices are available with different plane orientations of the wafer material. A preferred plane orientation might be used by a given manufacturer.

Silicon, the most common single material used in microelectromechanical systems (MEMS), is an anisotropic crystalline material whose material properties depend on orientation relative to the crystal lattice. This fact means that the actual value of E for analyzing two different designs in silicon may differ by up to 45% depending on the alignment of the design against the Young's modulus anisotropy.

An article in the JOURNAL OF MICROELECTROMECHANICAL SYSTEMS, VOL. 19, NO. 2, APRIL 2010: What is the Young's Modulus of Silicon? (Matthew A. Hoperoft, Member, IEEE, William D. Nix, and Thomas W. Kenny) presents the best known elasticity data for silicon, both in depth and in a summary form.

Another article gives a summary about "The variation and visualization of elastic anisotropy in rock-forming minerals" (David Healy, Nicholas Erik Timms, and Mark Alan Pearce).

Both articles are background information for the invention and are included here by reference.

In the description below crystallographic directions and planes are described by Miller indices. The following Miller index notation is used:

[hkl]: the direction of a vector given by hkl
(hkl): the crystal plane perpendicular to the vector [hkl]
<hkl>: the family of symmetric direction vectors equivalent to hkl
{hkl}: the family of planes equivalent to the (hkl) plane The most used crystal orientation for a wafer in silicon semiconductor manufacturing is the (100) plane. However, other planes, such as for example the (001) plane, might also be possible.

Figure 3:
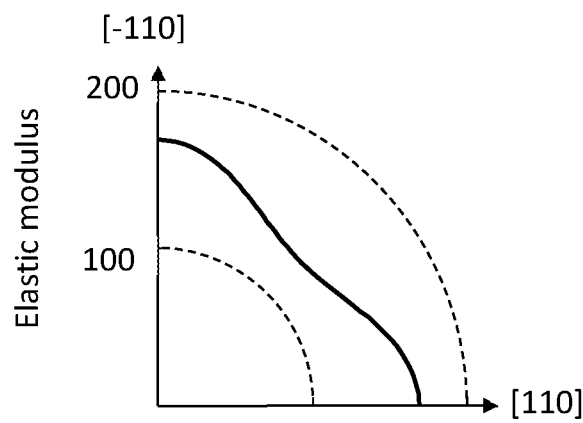
FIG. 3 shows a graph of the elastic modulus in function of the crystal orientation for a (001) plane wafer.

Because of the anisotropy of silicon, the elastic modulus (E), also called modulus of Young, depends on the crystal orientation and can vary between 130 GPa and 188 GPa. This dependency is shown in FIG. 3. The surface of the wafer is a (001) plane, and the graph shows the stiffness through a plane perpendicular to the surface. The angles show the angle between the normal of that perpendicular plane to the flat (notch). In this figure only the first quadrant is shown. In this example the direction corresponds with 0° and the [−110] direction corresponds with 90°.

Figure 4:
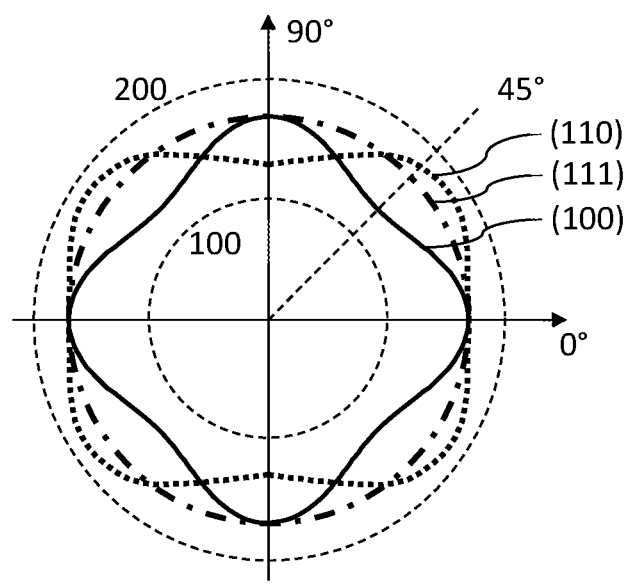
FIG. 4 shows a graph of the elastic modulus in function of the crystal orientation for the (100) plane wafer, the (111) plane wafer and the (110) plane wafer in the 360° domain.

If the wafer has a different orientation, then different graphs for the elastic modulus are obtained as illustrated in the 360° polar plot of FIG. 4. Besides the elastic modulus for the (100) plane wafer (or equivalent family members), also the elastic modulus for the (111) plane wafer (or equivalent family members) and the elastic modulus for the (110) plane wafer (or equivalent family members)) is shown. It can be seen from FIG. 4 that the elastic modulus for the (100) plane is anisotropic and has a 90° rotational symmetry. The trace of the elastic modulus, moreover is symmetric with respect to the 45° line. The absolute value of the modulus of Young is identical for X=0 and Y=0.

The elastic modulus for the (110) plane is anisotropic and has a 90° rotational symmetry. Also for this plane the elastic modulus in the first quadrant can be mirrored to the second, third and fourth quadrant. Within a quadrant there is no symmetry in the trace. The absolute value of the modulus of Young is different for x=0 and y=0.

The elastic modulus for the (111) plane is isotropic. It is the same for all quadrants in any direction and has a circular shape. In this case the symmetry is 0°.

Other wafer materials might have other behaviors and other symmetries of the modulus of Young. There might for example be a 180° symmetry. In another example a hexagonal nature of the modulus of Young leads to a symmetry of 60°. In another example the modulus of Young has a ellipsoidal nature, leading to a symmetry of 180°.

Figure 5:
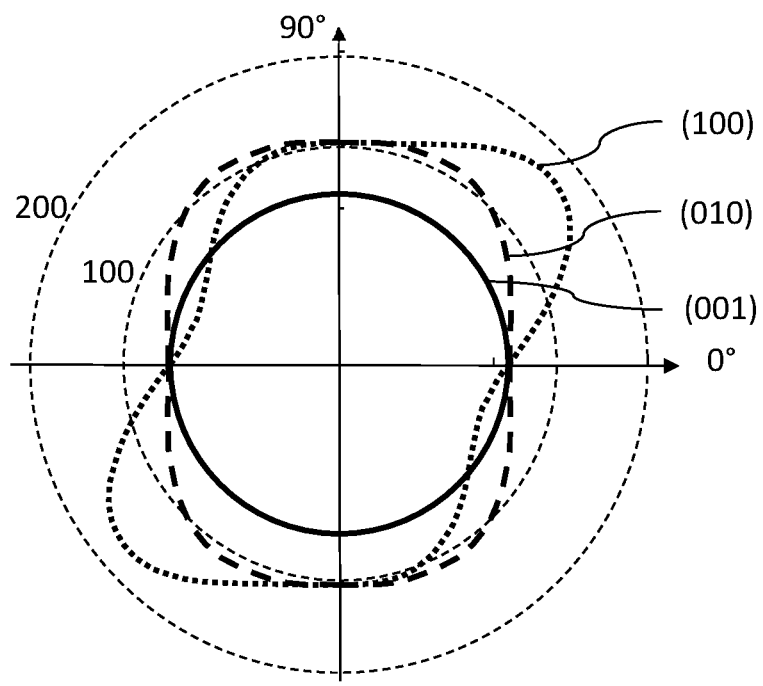
FIG. 5 shows some possible different modulus of Young symmetries in the 360° domain.

In the graph of FIG. 5 some possible different modulus of Young symmetries in the 360° domain are shown. These are obtained for different planes of an alpha-quartz crystal. In this example the modulus of Young of the (100) plane has a 180° symmetry and the modulus of Young of the (010) plane has a 90° symmetry. In a 90° symmetry graph, the 360° view can be created by rotating the first quadrant to the second, the third and the fourth quadrant. The modulus of Young of the (001) plane has a circular shape.

In a first aspect embodiments if the present invention relate to a unit trench capacitor wherein the trench follows the modulus of Young in order to take advantage of a stress reduction in the trenches in certain directions leading to a reduced wafer bow and thus also to a reduced intrinsic stress for a better wafer handling during manufacturing on one side and a higher reliability and robustness of the capacitors on the other side.

A unit trench capacitor 100 according to embodiments of the present invention is formed in a substrate 110. The unit the unit trench capacitor 100 comprising one or more trenches 131 in the substrate 110, a dielectric layer 120, a first electrode 112 and a second electrode 130. Walls of the one or more trenches 131 are covered by the dielectric layer 120 which separates the first electrode 112 from the second electrode 130. In embodiments of the present invention each trench follows a closed curve. Either the closed curve of each trench has one or more elongated parts 150 in directions in which the substrate 110 has a maximum elastic modulus, or the closed curve of each trench has a circular shape in case the substrate 110 has an isotropic elastic modulus.

It is an advantage of embodiments of the present invention that the intrinsic material stress in the material is reduced by providing trenches which follow the elastic modulus. This is achieved by providing trenches which have one or more elongated parts in directions in which the substrate has a maximum elastic modulus or by providing trenches which have a circular shape if the substrate has an isotropic elastic modulus. In embodiments of the present invention the highest amount of trenches per unit distance are created perpendicular to the direction of the trench to reduce the stress (i.e. the density of the trenches is the highest in the directions with highest Young's modulus). When the stiffness is the highest in the direction of the trench, this results in a reduced bending of the structure by the stress at the walls. As a result of the reduced intrinsic material stress a reduced warpage and thus a reduced wafer bow is obtained, which is advantageous for a reliable wafer handling during manufacturing. The wafer bow is defined in µm as the deviation of the wafer center compared to the wafer border in z direction (out of plane deviation). It can have positive or negative values. The wafer bow as such is a significant indication for intrinsic stress in the capacitor structure. It is an advantage of embodiments of the present invention that a trench capacitor structure with a reduced wafer bow is obtained.

In order to reach a high capacitance value, a large surface area should be provided for arranging conductive layers and dielectric layers that form a trench capacitor. In order to increase the capacitance value a unit trench capacitor may comprise more than 2 trenches, wherein the trenches are arranged concentrically. Each conductive layer in this stack is sandwiched between the one or more dielectric layers.

The reason, why trench capacitors and in specific trenches introduce a bow or warpage of the device and the wafer can be given as follows:

The capacitor needs a large surface of a thin dielectric covered with a conductor.

Due to different thermal expansion coefficients between the substrate and the at least one dielectric layer as well as the top electrode material—e.g. polysilicon or metal—a stress at the layer interfaces is created resulting in a wafer bow. Such stress can also be created by the deposition technique itself.

In some applications the dielectric has to be thick to withstand 900 volt, typically this is approx. 2 µm, depending on the used dielectric material.

The capacitance per area of a flat capacitor with e.g. 2 µm thickness of the dielectric layer is too small to make a sufficiently dense and thus useful capacitor out of it, therefore trench capacitors are in scope where the electrode surface is enlarged on the side walls of trenches.

The surface of the capacitor can be increased by introducing trenches but this also increases the stress and therefore also the wafer bow. The stress/wafer bow depends on the arrangements of the trenches related to the design of the trenches and the crystal orientation of the wafer substrate.

Deeper trenches introduce more surface which in general also leads to more stress and wafer bow.

As explained when discussing the advantages of a unit trench capacitor according to embodiments of the present invention, the inventors have, despite these issues, found a unit trench capacitor structure with a reduced intrinsic material stress.

In a second aspect embodiments of the present invention relate to a trench capacitor 200 comprising a plurality of unit trench capacitors 100 according to embodiments of the present invention wherein the unit trench capacitors are connected in parallel. The unit trench capacitor or preferably the plurality of unit trench capacitors connected in parallel may form a trench capacitor suitable for an RC snubber circuit.

In a trench capacitor 200 according to embodiments of the present invention the unit trench capacitors may be arranged such that the space between the unit trench capacitors is minimized.

Figure 10:
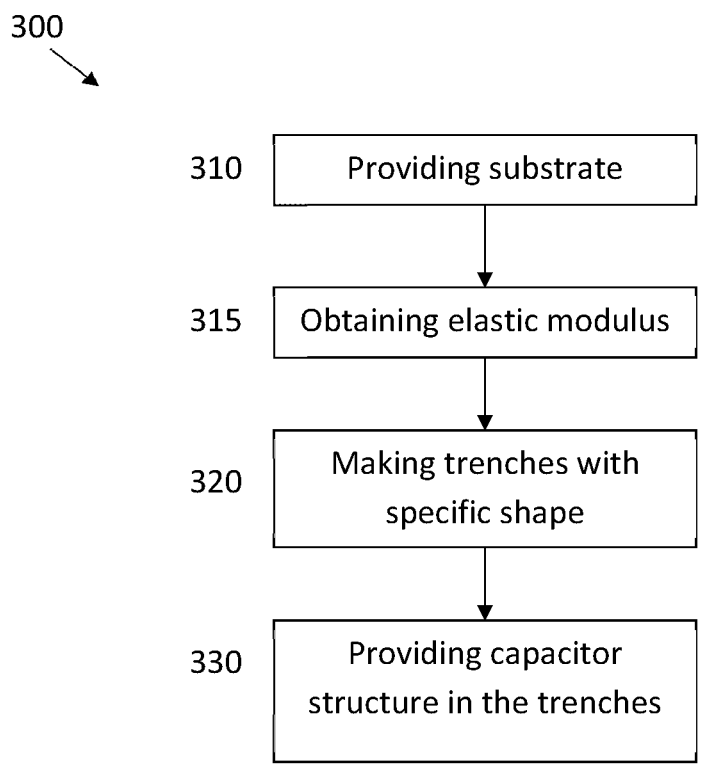
FIG. 10 shows an exemplary flow chart of a method in accordance with embodiments of the present invention.

In a third aspect embodiments of the present invention relate to a method 300 for making a unit trench capacitor. A flow chart of an exemplary embodiment of such a method is illustrated in FIG. 10. The method comprises providing 310 a substrate. This may be a conductive or dielectric substrate.

In embodiments of the present invention the method comprises obtaining 315 one or more substrate specifications. The method comprises obtaining 315 the elastic modulus 315 of the substrate in different directions of the substrate. If it is for example not already known, the method comprises determining the elastic modulus (i.e. the modulus of Young) in different directions.

The method, moreover, comprises making 320 one or more trenches in the substrate wherein each trench follows a closed curve, and wherein the closed curve of each trench has one or more elongated parts 150 in directions in which the substrate 110 has a maximum elastic modulus or wherein the closed curve of each trench has a circular shape if the substrate 110 has an isotropic elastic modulus. Making the trenches may for example be done by etching.

This may for example be achieved by Deep Reactive Ion Etching (DRIE) as that will result in trenches that have vertical walls. Preferably the walls are substantially vertical such that they can be properly filled. The DRIE may for example be applied in a silicon substrate.

The method, moreover, comprises providing 330 a dielectric layer 120, a first electrode 112 and a second electrode 130, such that walls of the one or more trenches 131 are covered by a dielectric layer 120 which separates the first electrode from the second electrode 120.

In embodiments of the present invention Low Pressure Chemical Vapour Deposition techniques (LPCVD) or Plasma Enhanced Chemical Vapour deposition techniques (PECVD) may be used for providing a dielectric layer.

In case of a silicon substrate, a first layer of dielectric can be formed on the silicon substrate by oxidizing the silicon surface of the base wafer. This has the advantage that the $SiO_2$ is of very high quality and that sharp corners are rounded. Subsequent layers can be formed by LPCVD techniques at relatively high temperature to assure that a minimum of dangling bonds remain in the atomic structure. An alternative for depositing the subsequent layers with LPCVD is to use PECVD at lower temperatures and improving the atomic structure after deposition with an annealing bake at high temperatures (700-1000° C.).

Another method to deposit layers with a very high quality at low deposition temperatures is to use Atomic Layer Deposition techniques (ALD). This type of deposition results in high quality layers, but the deposition time today is very long and not suitable in production for layers thicker than 500 nm.

In embodiments of the present invention wherein the substrate serves as the first electrode, providing the first electrode is already achieved when providing the substrate.

In the following paragraphs the different aspects of the present invention will be further elaborated and illustrated using different exemplary embodiments.

Figure 2:
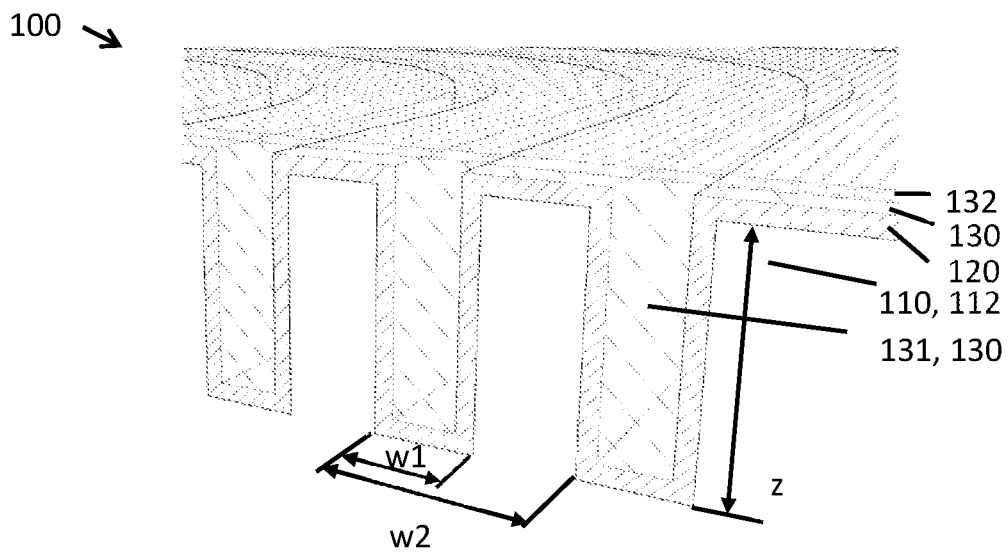
FIG. 2 shows a more detailed schematic drawing zoomed into three trenches of the unit trench capacitor of FIG. 1.

FIG. 1 shows a 3D schematic drawing of a cross section of a unit trench capacitor 100 comprising a substrate 110 wherein the substrate 110 is also used as first electrode 112. FIG. 2 shows a schematic drawing zoomed into three trenches of FIG. 1. One or more trenches 131 are provided in the substrate 110. The substrate may for example be a silicon substrate. The substrate may be an undoped substrate or a doped substrate. The invention is, however, not limited thereto. Other materials may also be used for the substrate. These can be conductive. In that case they can be used as first electrode. Alternatively the substrate material may be non-conductive, in which case a conductive layer must be provided on the substrate covering the surface comprising the trenches. This means the top of the substrate, the sidewalls of the trenches, and the bottom of the trenches. This conductive layer should be provided before providing the dielectric layer 120. The dielectric layer 120 may be a single dielectric layer or a stack of dielectric materials. The dielectric layer may for example be a $SiO_2$ or a $Si_3N_4$ layer. A stack may for example be a stack of a $SiO_2$ layer and a $Si_3N_4$ layer. A second electrode 130 is provided on the dielectric layer 120. The dielectric layer 120 separates the first electrode from the second electrode 130. The second electrode may for example be polysilicon or any other conducting material or stack of conducing materials on top of the dielectric. The trenches are filled with this second electrode 130. In embodiments of the present invention the second electrode may be covered by one or more additional conducting layers. Thus, a stack of electrodes is obtained. For example poly-silicon may be filling the trenches and one or more conducting layers (such as e.g. aluminum) may be covering the conducting poly-silicon.

Each trench follows a closed curve. In embodiments of the present invention each trench has one or more elongated parts 150 in directions in which the substrate 110 has a maximum elastic modulus. Changes in the direction of the trenches 131 are obtained by rounded parts 140 or corners 140.

In embodiments of the present invention changes in direction of the trenches may be following a sharp corner (i.e. not rounded). A sharp corner could also be considered as a rounded corner with a radius of 0 µm. These should not be excluded from the invention. Following a rounded curve is, however, more advantageous as this results in a reduced electrical field and therefore reduced leakage currents and increased reliability. Rounded corners where the elastic modulus is reduced, moreover, better follow the changes of the elastic modulus between elongated parts where the elastic modulus is maximum. In embodiments of the present invention the radius of the rounding may for example be larger than 3 times the width of the trenches or even larger than 30 or 300 times the width w1 of the trenches. In embodiments of the present invention (such as for example illustrated in FIG. 1) the rounded parts 140 of adjacent trenches are parallel with each other.

In the example of FIG. 1 the substrate surface is a (100) plane. The elongated parts 150, which in this case are straight areas are aligned in the directions of the substrate 110.

In the example of FIG. 1 the middle of the rounded parts 140 is located on an angle bisector between the x ([110]) and y ([−110]) axis for all the trenches.

In the example illustrated in FIG. 1, bow is created by stress between the silicon base 110 and the dielectric layers 120 over length. In fact, the bow scales with the square of the length. One can limit the stress at the surface in a certain direction by making a trench perpendicular to that direction. The more trenches per unit length are present the more the build-up of stress over length is reduced and the more wafer bow is reduced. Maximum reduction of bow is therefore realized when the density of trenches is the highest in the directions with highest Young's modulus, which are the directions.

With the alignment of the straight areas 150 in the directions the number of trenches per unit length is also higher in the directions perpendicular to the length direction of the trenches than for the corner areas 140 in the directions. Therefore a minimum bow is realized by aligning the straight areas in the directions as in this way the highest number of trenches per unit length are provided to interrupt the stress build-up in the [110] directions with highest Young's modulus.

In embodiments of the present invention the depth of the trench 131 may for example be between 5 and 100 µm. This depth is indicated by index z in FIG. 1.

In embodiments of the present invention a width of the trench 131 is between 1 and 10 µm. This width is indicated by index w1 in FIG. 1.

In embodiments of the present invention the unit trench capacitor comprises at least two trenches, wherein a pitch between neighboring trenches is between 2 and 20 µm. This pitch is indicated by index w2 in FIG. 1.

Figure 13:
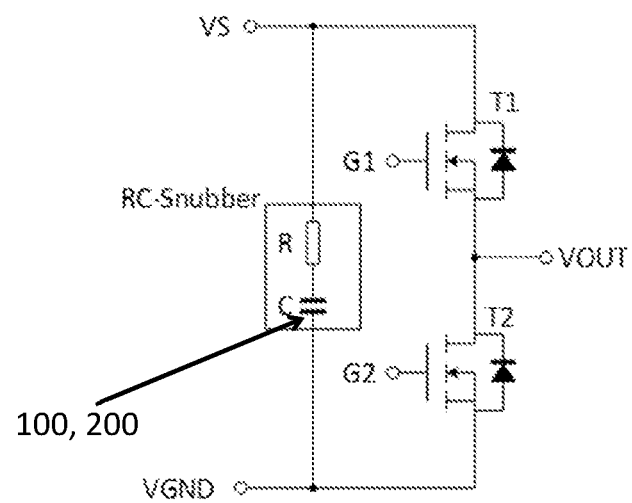
FIG. 13 shows an electronic scheme of an RC-snubber device in accordance with embodiments of the present invention.

An RC-snubber device, according to embodiments of the present invention, comprises a resistor connected in series with a trench capacitor or a unit trench capacitor according to embodiments of the present invention. FIG. 13 shows an electronic scheme of an RC-snubber device comprising an RC circuit, comprising a unit trench capacitor 100 or a trench capacitor 200 in series with a resistor, connected in parallel with a series connection of transistors T1 and T2, in accordance with embodiments of the present invention. The snubber structure is connected directly to the power rails and suppresses transients caused by switching of the switching transistors T1 and T2. In embodiments of the present invention the resistor may be an integral part of the unit trench capacitor and therefore the trench capacitor. The resistance value can be derived by adjusting the conductivity of the first electrode and/or by adjusting the conductivity of the second electrode. This offers the advantage, that no external resistor must be provided. By doing so, the resistor is an integral part of the unit trench capacitor and the trench capacitor. Further, the conductivity might be varied by a given doping. This will lead to an adjustable resistance, that can also be varied depending on the application requests independently on the design of the unit trench capacitors (e.g. length and width of the electrodes). In any case the resistor is always a resistor connected in series to the unit trench capacitor and thus also to the trench capacitor. In any case the resistor is connected in series to the unit trench capacitor and thus also the trench capacitor.

The resistance of the RC snubber application may for example range between 0.2Ω and 20Ω. In embodiments of the present invention the capacitance of the trench capacitor may for example range between 1 nF and 20 nF.

In embodiments of the present invention the wafer bow for a 6 inch wafer may for example be limited to +/−50 µm and the bow for an 8 inch wafer to +/−150 µm.

In the example of FIG. 1 the trenches are arranged in a concentric way.

Figure 6:
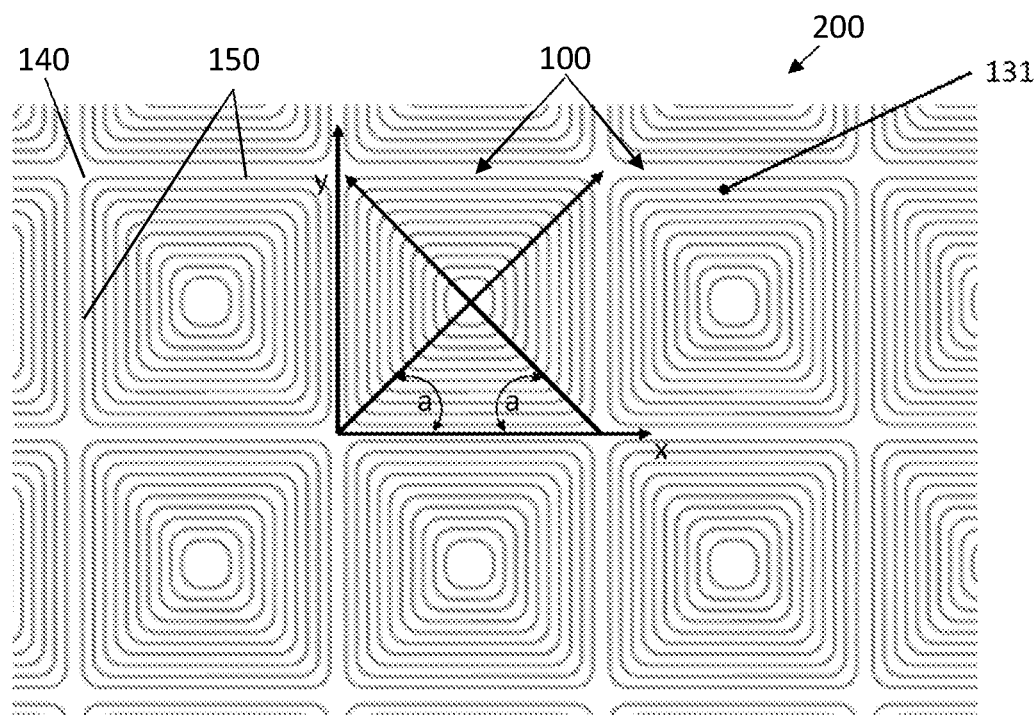
FIG. 6 is a schematic drawing of grouped unit trench capacitors as in FIG. 1 into a single trench capacitor, in accordance with embodiments of the present invention.

In embodiments of the present invention the elastic modulus has a periodicity of 90° and the closed curve has a substantially square shape. FIG. 6 shows the grouping of the unit trench capacitors of FIG. 1 to a single trench capacitor 200 in plane view for e.g. a (100) plane of Silicon. It can be seen that the arrangement of trenches follows a 90° rotational symmetry. The trenches and thus the layers of the trench capacitor are arranged following a straight line in x direction (0°) and y direction (90°) with an equal length as the modulus of Young in FIG. 3 is of an equal value for the x- and y-direction.

Where the trenches are oriented in the x-direction the stress in the y-direction is interrupted.

A further arrangement of this embodiment is, that the straight trenches follow the highest value of the elastic modulus, thus in the 0° and 90° direction, while the middle of corners or edges are arranged to an angle of a=45° following the lowest value of the elastic modulus (modulus of Young).

In a preferred embodiment the corners are rounded with a radius>0. The 1st reason for rounding the corners is to follow the modulus of Young from a higher value (the straight areas 150 of the trenches are aligned to that) to a lower value, to what the corners are aligned, again to a higher value of the modulus of young to what the second straight areas 150 are arranged.

The second reason is to limit the electric field. The smaller the rounding, the higher the electric field is at the rounding. Since higher electric fields give rise to higher leakage currents and therefore reduced reliability, higher rounding is preferred.

As already mentioned, in this preferred embodiment the space between the unit trench capacitors can be kept minimal, which leads to a compact and a small structure with a high capacitance per area for the trench capacitor.

It is found by the inventors that this trench capacitor arrangement is optimal for all 90° symmetries of the modulus of Young for an anisotropic behavior of any used wafer material with a given crystal orientation on the surface plane.

Figure 7:
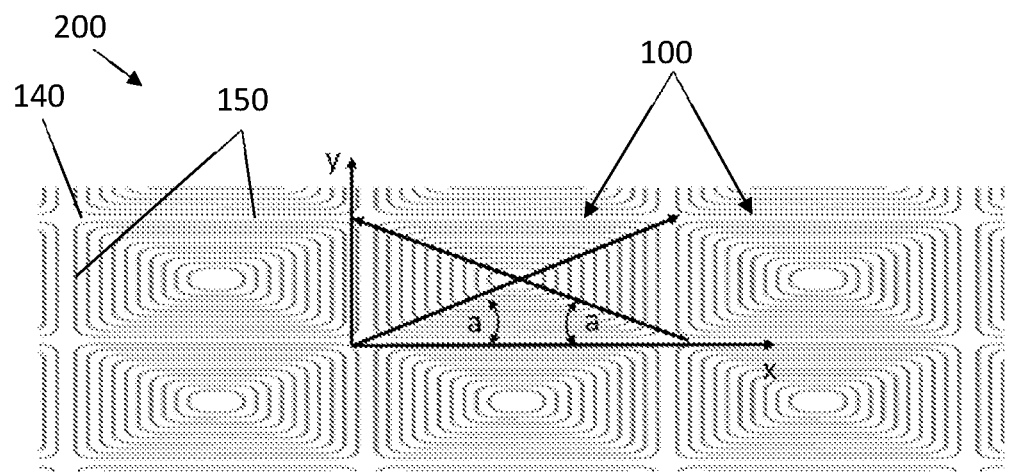
FIG. 7 shows an example of a trench capacitor arrangement according to embodiments of the present invention for e.g. a substrate with a 180° symmetry of the elastic modulus.

In embodiments of the present invention the elastic modulus has a periodicity of 180° and the closed curve has a substantially rectangular shape. FIG. 7 shows an example of a trench capacitor arrangement 200 according to embodiments of the present invention for e.g. a substrate with a 180° symmetry of the elastic modulus. In this example the highest modulus of Young is in the y direction.

The trenches again follow the x and y directions as straight lines 150 and follow with that the highest values of the modulus of Young (i.e. the elongated parts 150 are in directions in which the substrate has a maximum elastic modulus; note that this may be a local maximum). The lengths of the trenches in this embodiment are arranged in a way, that they are indirectly proportional to the two highest values of the modulus of Young, what might be different in x- and y-directions. Or in other words, the highest value for the elastic modulus E is in the direction of the shorter length of the trench, while the lower value of the elastic modulus is arranged in the direction of the longer length of the trench. In this way the highest number of trenches per unit length that interrupt the surface is in the direction of the highest modulus of Young.

In embodiments of the present invention the edges or rounded corners are in the direction to the lowest elastic modulus E.

Depending on where the focus of optimization is (the trenches in their lengths or the corners/edges, and depending on where the 180° symmetry line is, this optimization might also lead to a rhombic arrangement of the trenches. The length of the sides of the rhombic structure might be all the same or two parallel sides might be longer than the other 2 parallel sides.

Also for this arrangement the trenches are preferably arranged in a concentric way. The corners are preferably all rounded and have a radius such that adjacent trenches are parallel with each other.

In embodiments of the present invention the grouping of the unit trench capacitors is such that the space between the unit trench capacitors is reduced to a minimal distance. This distance may be the same distance as the distance w2 between trenches in a unit trench capacitor.

Figure 8:
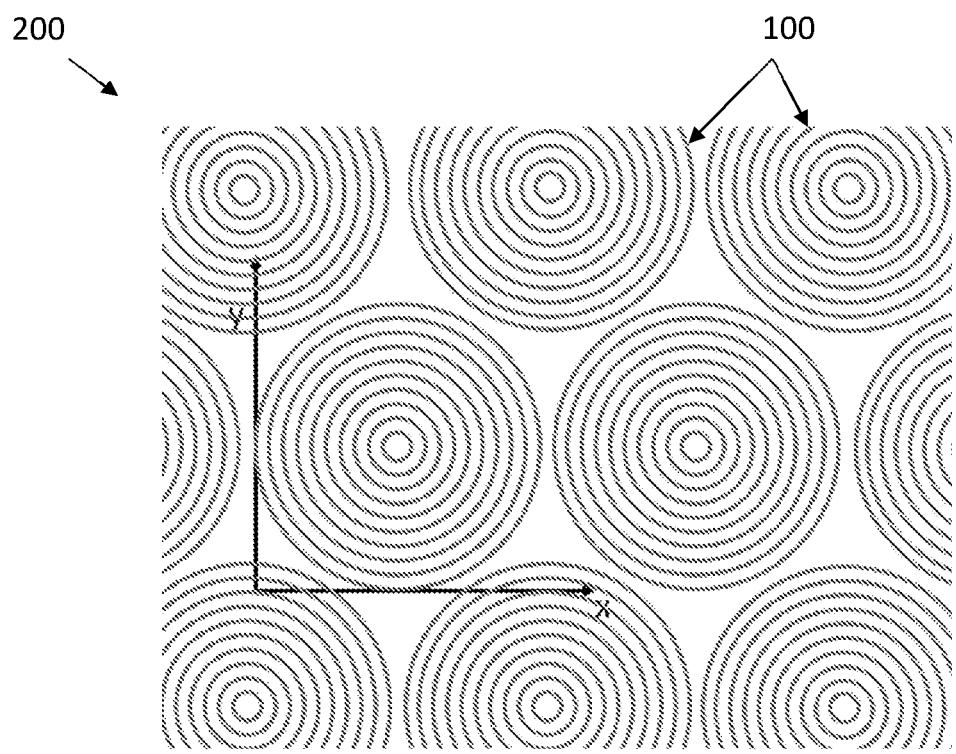
FIG. 8 shows grouped unit trench capacitors for e.g. a (111) plane arrangement in Silicon, in accordance with embodiments of the present invention.

FIG. 8 shows grouped unit trench capacitors for e.g. a (111) plane arrangement in Silicon. As it has previously been worked out, the modulus of Young is in this plane of silicon isotropic, meaning there is no direction dependency of the elastic modulus. This leads to a rotational symmetric design of the unit trench capacitors 100. Also here the trenches are arranged in a concentric way. The corners are all rounded and adjacent corners are parallel with each other.

Several other designs for the unit trench capacitors might be derived as for instance a hexagonal or ellipsoidal unit trench capacitor. The closed curve preferably has a square shape for an elastic modulus with a 90° deg symmetry (with an elastic modulus with symmetry 4*90°=360°, the closed curve has preferably 4 sides with the same length). The closed curve preferably has a rectangular shape for an elastic modulus with a 180° deg symmetry (with an elastic modulus with symmetry 2*180=360°, the closed curve has preferably 2 sides with the same length). For an elastic modulus with a 60° (6*60°=360°) the shape of the closed curve is preferably one of 6 sides with the same length, thus a hexagonal shape. A hexagon can be constructed out of 3 rhombuses. As discussed earlier, a 180° symmetric elastic modulus may lead to a rhombic arrangement of trenches. In embodiments of the present invention a 120° symmetry of the elastic modulus may lead to triangles with same side length.

Figure 9:
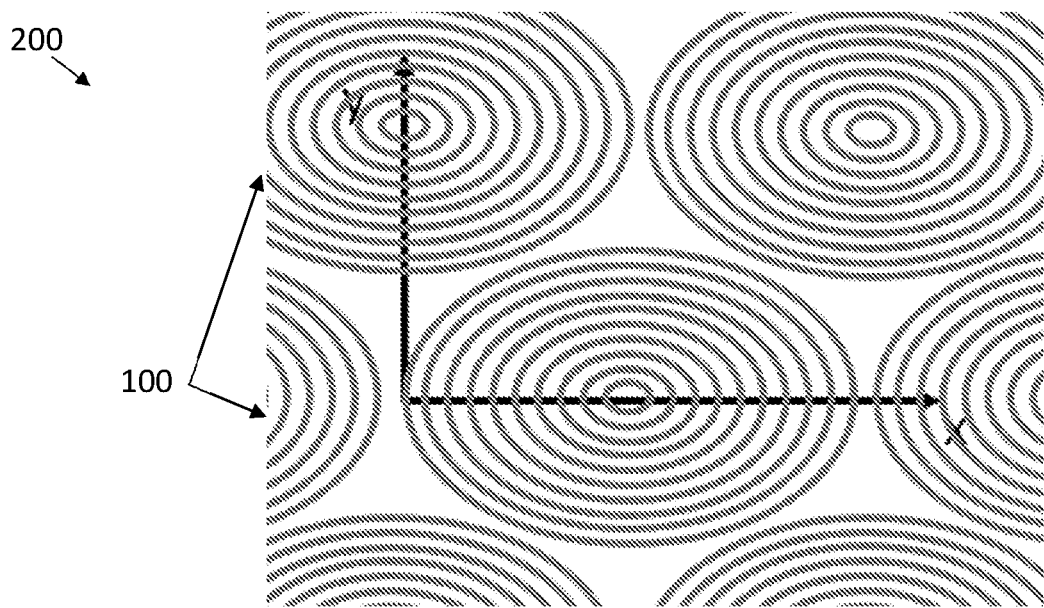
FIG. 9 shows an ellipsoidal unit trench capacitor and a trench capacitor comprising a plurality of such ellipsoidal unit trench capacitors, in accordance with embodiments of the present invention.

FIG. 9 shows a trench capacitor 100 comprising a plurality of ellipsoidal unit trench capacitors 100. In this example there is a maximum value of the elastic modulus E in the x direction, and there is a minimum value of the elastic modulus E in the y direction. In such an ellipsoidal unit trench capacitor the trenches in the x direction may be considered as the elongated parts, and the trenches in the y direction may be considered as the rounded parts. In a ellipsoidal design it is advantageous that adjacent trenches are substantially parallel with each other. The same is also preferable for the distance from one trench to the other in x and in y direction. This needs to be considered for designing capacitors with a certain breakdown voltage, as the break down voltage scales with the distance.

Figure 11:
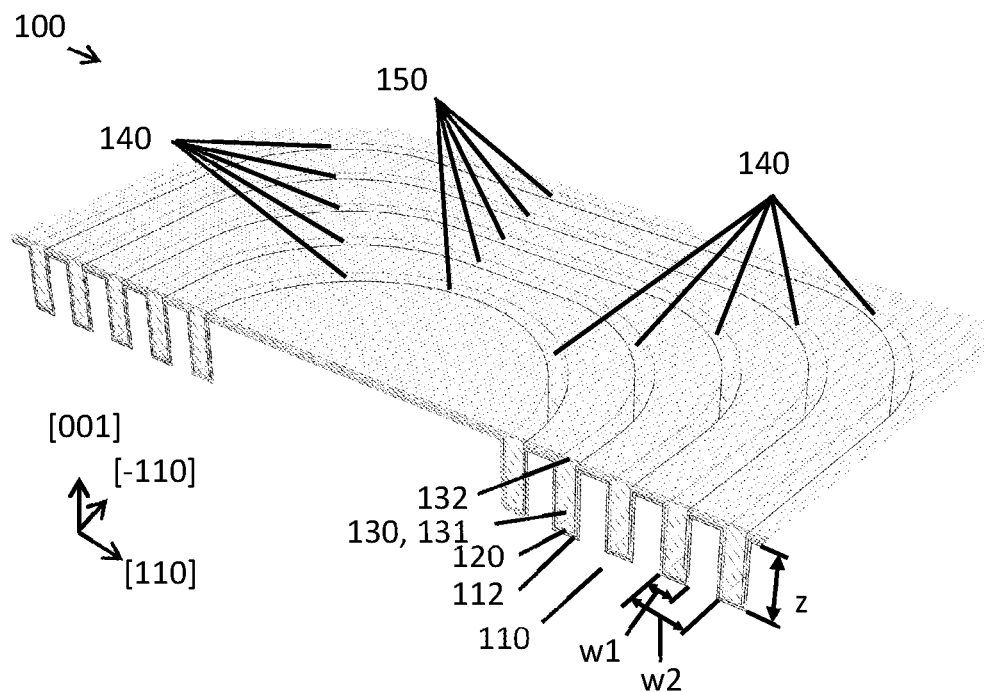
FIG. 11 shows a 3D schematic drawing of a cross section of a unit trench capacitor, with a non-conductive substrate, in accordance with embodiments of the present invention.
Figure 12:
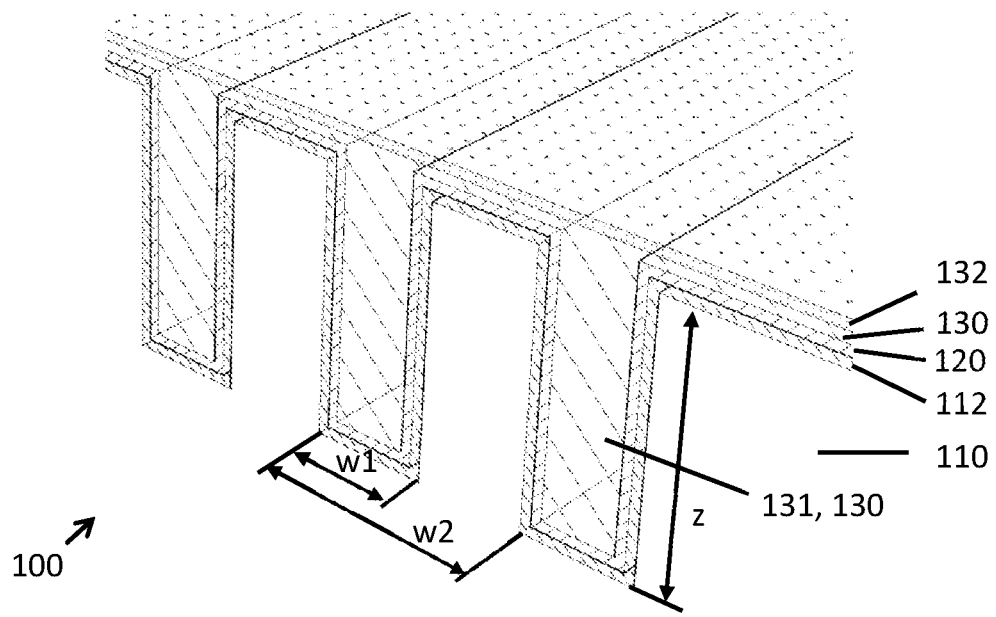
FIG. 12 shows a more detailed schematic drawing zoomed into three trenches of the unit trench capacitor of FIG. 11.

In embodiments of the present invention the substrate may be a dielectric substrate. An example thereof is illustrated in the schematic drawings of FIG. 11 and FIG. 12. The figures show the substrate 110. The substrate 110 may for example be a quartz substrate. In the dielectric material of the substrate 110 trenches 131 might be formed. A conductive layer (e.g. polysilicon) might be deposited on the substrate with the trenches. The deposited conductive layer (e.g. polysilicon) might serve as a first electrode 112. On top of this first electrode 112 a dielectric layer 120 as e.g. $SiO_2$ or a stack of dielectric layers might be deposited. And on top of the dielectric layer or stack of dielectric layers a second conductive layer as e.g. again polysilicon or a stack of conducting layers or any other conductive material might be brought serving as second electrode 130. Also in this arrangement the trenches 131 follow the modulus of Young of the substrate (i.e. elongated parts in directions in which the substrate has a maximum elastic modulus). A stack of conducting layers may be provided by stacking one or more additional conducting layers (e.g. an aluminum conducting layer 132) on the second electrode 130.

It is an advantage of the exemplary embodiments illustrated in FIG. 6, 7, 8, 9 that these capacitors can easily be scaled. If four instance a capacitor with a lower capacitance is needed for an RC snubber adapted for a given application, then for instance every second unit capacitor might be removed out of the grouped unit capacitors. In that case the distances between all unit capacitors is not minimum anymore.

In embodiments of the present invention the arrangement of trenches, electric and dielectric layers follow the modulus of Young/elastic modulus E.

In embodiments of the present invention the straight/elongated areas of the trenches are arranged in the direction of the higher values of the modulus of Young.

In embodiments of the present invention the corners/edges are arranged to the smallest values of the modulus of Young.

As in the quadrants of the modulus of Young there might be several maxima or minima of the modulus of Young. In embodiments of the present invention the highest value is assigned for a length of a trench while the lowest value is arranged for a corner/edge of a trench. Out of the previous definitions other lengths and corners as well as their locations may be derived.

In embodiments of the present invention the unit trench capacitors are grouped together and form a bigger capacitor. For the grouping, independent on the design, the unit trench capacitors may be arranged so that the space between the unit trench capacitors gets minimal. By following that, an optimal capacitor suitable for an RC-Snubber can be derived.

In an experiment, the arrangement of unit trench capacitors to a trench capacitor according to FIG. 6 has been tested and compared to several other trench capacitors, which do not follow the idea of aligning the trenches of unit trench capacitors to the modulus of Young.

As the used wafer material was Silicon in a (100) orientation, in the chosen preferred geometry and in line to embodiments of this invention, the trenches have been arranged in squares in a concentric way with rounded corners wherein adjacent corners are parallel with each other. All according FIG. 6.

| Layout Version | % coverage of the trench area/top area of the component | Wafer Bow for 48 μm deep trench | Wafer Bow for 70 μm deep trench |
| --- | --- | --- | --- |
| Dotted holes | 11.5% | 130 μm | — |
| Stripes | 27.1% | 60 μm | — |
| Concentric rounded corner squares (according FIG. 6) | 37.5% | 20 μm | 40 μm |
| Doughnuts | 35.5% | 80 μm | — |

It can be seen that this preferred configuration delivers the minimum wafer bow. Or the trench depth can be increased, so that, for this example, a maximum allowed wafer bow of +/−50 μm will be insured, which will increase the achievable capacitance density value compared to other realizations.

Besides that, also the compactness of the layout of this preferred configuration is the best as it also delivers the highest capacitance per area compared to other realizations for a trench capacitor.

The invention claimed is:

1. A unit trench capacitor in a substrate, the unit trench capacitor comprising one or more trenches in the substrate, a dielectric layer, a first electrode and a second electrode,
    wherein walls of the one or more trenches are covered by the dielectric layer which separates the first electrode from the second electrode,
    wherein each trench follows a closed curve, and
    wherein the closed curve of each trench has one or more elongated parts in directions in which the substrate has a maximum elastic modulus, or
    wherein the closed curve of each trench has a circular shape if the substrate has an isotropic elastic modulus.

2. The unit trench capacitor according to claim 1, wherein changes in direction of the trenches are following a rounded part in the closed curve.

3. The unit trench capacitor according to claim 1, wherein the unit trench capacitor comprising more than 2 trenches, wherein the trenches are arranged concentrically.

4. The unit trench capacitor according to claim 1, wherein changes in direction of the trenches are following a rounded part in the closed curve;
    wherein the unit trench capacitor comprising more than 2 trenches, wherein the trenches are arranged concentrically;
    wherein the rounded parts of adjacent trenches are parallel with each other.

5. The unit trench capacitor according to claim 1, wherein a depth of the trench is between 5 and 100 μm.

6. The unit trench capacitor according to claim 1, wherein a width of the trench is between 1 and 10 μm.

7. The unit trench capacitor according to claim 1, the unit trench capacitor comprising at least two trenches, wherein a pitch between neighboring trenches is between 2 and 20 μm.

8. The unit trench capacitor according to claim 1 wherein the substrate is a semiconductor substrate.

9. The unit trench capacitor according to claim 1 wherein the first electrode is the semiconductor substrate.

10. The unit trench capacitor according to claim 1 wherein the substrate is a dielectric substrate.

11. The unit trench capacitor according to claim 1, wherein the closed curve has a square or rectangle or rhomboid, or hexagonal, or circular, or ellipsoidal shape.

12. The unit trench capacitor according to claim 1, wherein the elastic modulus has a periodicity of 90° and wherein the closed curve has a substantially square shape or wherein the elastic modulus has a periodicity of 180° and wherein the closed curve has a substantially rectangular shape.

13. The trench capacitor, the trench capacitor comprising a plurality of unit trench capacitors according to claim 1, wherein the unit trench capacitors are connected in parallel.

14. An RC-snubber device to suppress transients in an electrical system, the RC-snubber device comprising a resistor connected in series with a unit trench capacitor according to claim 1.

15. The unit trench capacitor according to claim 1, wherein the closed curve of each trench has one or more elongated parts in directions in which the substrate has a maximum elastic modulus.

16. The unit trench capacitor according to claim 1, wherein the closed curve of each trench has a circular shape if the substrate has an isotropic elastic modulus.

* * * * *